United States Patent
Abe et al.

(10) Patent No.: US 8,642,894 B2
(45) Date of Patent: Feb. 4, 2014

(54) CIRCUIT BOARD, METHOD OF MANUFACTURING THE SAME, AND RESISTANCE ELEMENT

(75) Inventors: Tomoyuki Abe, Kawasaki (JP); Norikazu Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 336 days.

(21) Appl. No.: 12/689,353

(22) Filed: Jan. 19, 2010

(65) Prior Publication Data

US 2010/0193225 A1 Aug. 5, 2010

(30) Foreign Application Priority Data

Feb. 2, 2009 (JP) ................................ 2009-021913
Oct. 2, 2009 (JP) ................................ 2009-230606

(51) Int. Cl.
*H05K 1/09* (2006.01)

(52) U.S. Cl.
USPC ........... 174/257; 361/760; 361/763; 361/766; 361/782; 361/811

(58) Field of Classification Search
USPC ......... 361/257, 760, 763, 766, 782, 738, 811; 174/138 J, 257
See application file for complete search history.

(56) References Cited

U.S. PATENT DOCUMENTS

| | | | |
|---|---|---|---|
| 5,243,320 A | | 9/1993 | Clouser |
| 5,847,326 A | * | 12/1998 | Kawakami et al. ........... 174/256 |
| 7,595,228 B2 | | 9/2009 | Abe |
| 2006/0158304 A1 | * | 7/2006 | Moriya ....................... 338/22 R |
| 2007/0077391 A1 | * | 4/2007 | Okamoto et al. ............. 428/116 |

FOREIGN PATENT DOCUMENTS

| | | |
|---|---|---|
| JP | 4-307701 | 10/1992 |
| JP | 5-205904 | 8/1993 |
| JP | 6-16441 | 3/1994 |
| JP | 2006-24740 | 1/2003 |
| JP | 2007-67035 | 3/2007 |
| JP | 4057589 B2 | 12/2007 |

OTHER PUBLICATIONS

Japanese Office Action mailed May 14, 2013, with English translation, in counterpart Japanese Application No. 2009-230606.

* cited by examiner

*Primary Examiner* — Timothy Thompson
*Assistant Examiner* — Andargie M Aychillhum
(74) *Attorney, Agent, or Firm* — Kratz, Quintos & Hanson, LLP

(57) ABSTRACT

Provided is a circuit board including a resin base, and a resistance element formed above the resin base. The resistance element includes a resistance pattern including an electrode portion and an extending portion, and an electrode formed on the electrode portion of the resistance pattern and including a foot portion reduced in thickness toward the extending portion.

9 Claims, 26 Drawing Sheets

CIRCUIT BOARD, METHOD OF MANUFACTURING THE SAME, AND RESISTANCE ELEMENT

CROSS-REFERENCE TO RELATED APPLICATIONS

This application is based upon prior Japanese Patent Application No. 2009-021913, filed on Feb. 2, 2009, and Japanese Patent Application No. 2009-230606, filed on Oct. 2, 2009, the entire contents of which are incorporated herein by reference.

FIELD

It is related to a circuit board, a method for manufacturing the same, and a resistance element.

BACKGROUND

Along with recent development in miniaturization and speeding-up of electronic equipment, it is becoming common to mount components on a circuit board with a high density. Such high density mounting can be achieved by miniaturization of components to be mounted. In recent years, passive components such as a resistance element and a capacitor mounted in a circuit board, for example, have been miniaturized by employing a technique for embedding the passive components between layers of the circuit board, instead of a conventional technique of mounting the passive components on electrodes on a circuit board surface by using solder.

As methods of manufacturing a resistance element serving as the passive component, a thick-film method and a thin-film method are known.

In the thick-film method, resistance elements are formed between layers of a circuit board by printing a resistor paste between the layers and thereafter baking the paste. Here, the resistor paste is made of epoxy resin and carbon filler particles dispersed in the epoxy resin. However, the thick-film method has a problem that the resistance elements vary in resistance value since the thickness of the paste is likely to vary from one resistance element to another in printing. As countermeasures against this problem, one possibility is to employ a method of adjusting outer shapes of the resistance elements by causing the baked paste to partially evaporate with irradiation of laser beams. However, employing this method causes enormous time and effort in adjusting the shapes of all of a large number of resistance elements to be formed on the circuit board.

In the thin-film method, by contrast, a resistor layer is patterned by wet etching, and thereby resistance elements each having a predetermined shape are formed. The resistance elements thus formed have the same thickness as that of the resistor layer. Accordingly, the problem that the resistance elements vary in thickness does not arise in the thin-film method. However, employing wet etching, which is isotropic etching, causes a problem that controlling outer shapes of the resistance elements after etching is difficult.

Some conventional techniques are disclosed in the specification of Japanese Patent No. 4057589, Japanese Laid-open Patent Publication No. hei 05-205904, and Japanese Laid-open Patent Publication No. hei 06-16441.

SUMMARY

According to one aspect discussed herein, there is provided a circuit board having a base, and a resistance element formed over the base, wherein the resistance element includes a resistance pattern including an electrode portion and an extending portion, and an electrode formed on the electrode portion of the resistance pattern and including a foot portion reduced in thickness toward the extending portion.

According to other aspect discussed herein, there is provided a resistance element having a resistance pattern formed on an insulating layer and including an electrode portion and an extending portion, and an electrode formed over the electrode portion of the resistance pattern and including a foot portion reduced in thickness toward the extending portion.

According to another aspect discussed herein, there is provided a method of manufacturing a circuit board, including forming a resistor layer and a conductive layer in this order over a base, reducing thickness of the conductive layer, selectively forming a first electrode pattern on the conductive layer, after reducing the thickness of the conductive layer, patterning the conductive layer, and thereby forming a conductive pattern, etching the resistor layer by using the conductive pattern as a mask, and thereby forming a resistance pattern including an extending portion extending from the first electrode pattern in a lateral direction of the base, and after forming the resistance pattern, patterning the conductive pattern, and thereby forming a second electrode pattern extending closer to the extending portion than the first electrode pattern extends.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

Prior to description of an embodiment, preliminary matters to be foundations of this embodiment will be described.

FIGS. 1A to 1D are perspective views illustrating, in the order of steps, a method of manufacturing a resistance element by using a thin-film method.

Figure 1A:
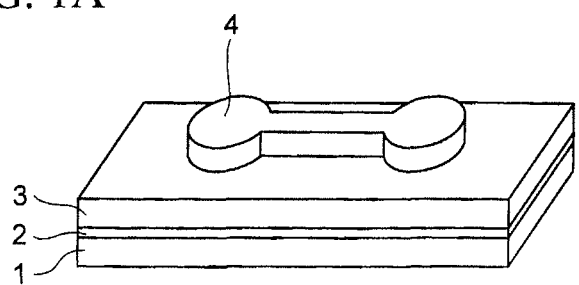
FIGS. 1A to 1D are perspective views illustrating, in the order of steps, a method of manufacturing a resistance element by using a thin-film method.

As depicted in FIG. 1A, to manufacture the resistance element, firstly, a resistor layer 2 and a conductive layer 3 are stacked on an insulation layer 1 in this order.

Here, a pre-preg layer having a thickness of approximately 0.1 mm is formed as the insulation layer 1, a nickel-phosphorus alloy foil having a thickness of approximately 0.35 µm is formed as the resistor layer 2, and a copper foil for which a thickness is standardized to be 18 µm or 35 µm is used as the conductive layer 3.

By attaching a dry film resist onto the conductive layer 3 and thereafter exposing and developing the dry film resist, a first resist pattern 4 is formed in a resistance pattern.

Figure 1B:
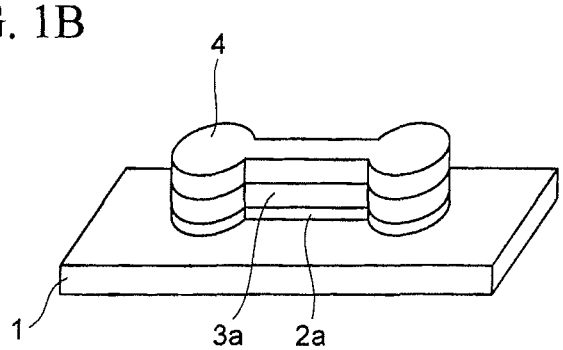
Figure 1C:
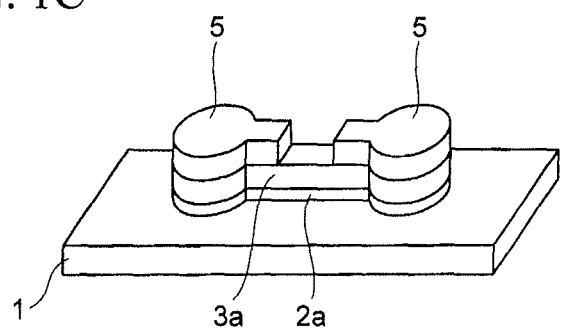

Then, as depicted in FIG. 1B, wet etching is performed on the conductive layer 3 and the resistor layer 2 by using the first resist pattern 4 as a mask. Thereby, the conductive layer 3 is formed into a conductive pattern 3a while the resistor layer 2 is formed into a resistance pattern 2a.

In this wet etching, different etchants are used for the resistor layer 2 and the conductive layer 3. Specifically, a mixed liquid of nitric acid and muriatic acid is used for the resistor layer 2, while a copper chloride solution is used for the conductive layer 3.

Upon completion of the etching, the first resist pattern 4 is removed.

Figure 10:
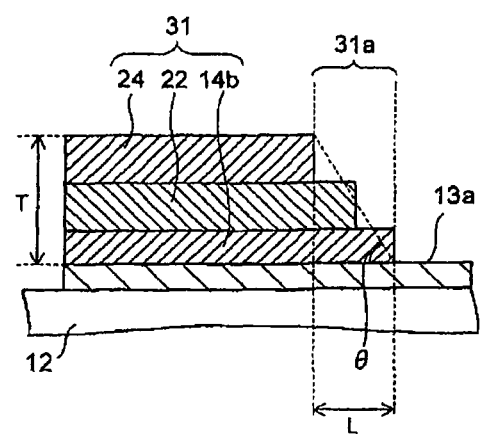
FIG. 10 is a cross-sectional view for explaining a preferable inclination of a foot portion of an electrode included in the resistance element in each of the embodiments.

Then, as depicted in FIG. 10, by attaching a dry film resist onto the conductive pattern 3a and thereafter exposing and developing the dry film resist, a second resist pattern 5 is formed.

Figure 1D:
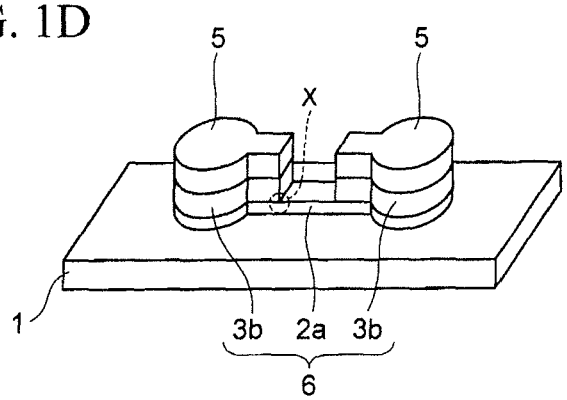

Subsequently, as depicted in FIG. 1D, wet etching is selectively performed on the conductive pattern 3a by using the second resist pattern 5 as a mask and copper chloride solution as an etchant. Thereby, electrodes 3b are formed respectively on both ends of the resistance pattern 2a.

After the formation, the second resist pattern 5 is removed.

Through the above-described steps, a basic structure of a resistance element 6 is completed.

In the above-described method of manufacturing the resistance element 6, the conductive pattern 3a is used as a hard mask for the resistor layer 2 in patterning the resistor layer 2 to form the resistance pattern 2a in the step depicted in FIG. 1B. Accordingly, the outer shape of the resistance pattern 2a ends up with depending on the outer shape of the conductive pattern 3a thereon.

However, the conductive pattern 3a is obtained by performing, on the conductive layer 3, wet etching, in which control of the amount of lateral etching is difficult. Accordingly, it is difficult to accurately form the outer shape of the conductive pattern 3a. For this reason, in manufacturing the resistance elements 6, the resistance values are likely to vary among the resistance patterns 2a respectively under the conductive patterns 3a; hence, stable mass production of the resistance elements 6 having a uniform resistance value is difficult.

Additionally, the copper foil commercially available as the conductive layer 3 to be subjected to wet etching is standardized to have a large film thickness, for example, 18 µm or 35 µm. Since an increase in the thickness of the conductive layer 3 makes control of the amount of lateral etching more difficult, patterning accuracy of the conductive pattern 3a further deteriorates due to the large thickness of the conductive layer 3.

Here, to improve the patterning accuracy of the conductive pattern 3a, also conceivable is to attach, to the resistor layer 2, the conductive layer 3 formed as a thin film having a thickness of approximately 10 µm. However, the conductive layer 3 thus thinly formed is difficult to handle, and is hence difficult to attach onto the resistor layer 2. Moreover, the thinner conductive layer 3 is more expensive, which consequently increases the manufacturing cost of the resistance element 6.

As described above, the resistance element 6 has inconvenience in a process aspect that the resistance value of the resistance element 6 varies from one case to another.

As to a structural aspect, since different materials are used for the resistance pattern 2a and the electrodes 3b, stress is likely to concentrate on a portion, near an end portion X of each of the electrodes 3b, of the resistance pattern 2a (see FIG. 1D) due to the difference in thermal expansion coefficient between the materials. Accordingly, if heat is applied to the resistance element 6, there is a possibility that cracks occur in the portion, near each end portion X, of the pattern 2a because of the stress. This occurs, for example, when the resistance element 6 is formed in a multi-layer wiring substrate, or when the resistance element 6 is used in electronic equipment. If such cracks occur, the resistance pattern 2a snaps, and consequently the resistance element 6 no longer performs its function in the circuit.

Furthermore, when the resistance element 6 is formed in a circuit board, stress applied to the resistance pattern 2a also depends on the thermal expansion coefficient of the circuit board. For example, if the difference in thermal expansion coefficient between the circuit board and the resistance element 6 is large, stress concentrates on the portion, near each end portion X, of the resistance pattern 2a, which may cause the resistance pattern 2a to snap.

In particular, when a circuit board uses a core substrate mainly made of carbon fibers, the thermal expansion coefficient of the circuit board is small compared with that of a circuit board made of a composite material including glass fibers and epoxy resin. For this reason, in this case, the difference in thermal expansion coefficient between the circuit board and the resistance element 6 is prominent. Hence, probability is high that the resistance pattern 2a would snap. Similarly, when a circuit board uses a metal core substrate made of Invar alloy, which is Fe—Ni alloy, thermal expansion of the circuit board is also small. In this case, the resistance pattern 2a is also likely to snap due to concentration of stress.

In view of the above-described fact, the inventor of the present invention has conceived embodiments to be described below.

First Embodiment

FIGS. 2A to 2M are cross-sectional views of a resistance element according to this embodiment in the course of being manufactured.

Figure 2A:
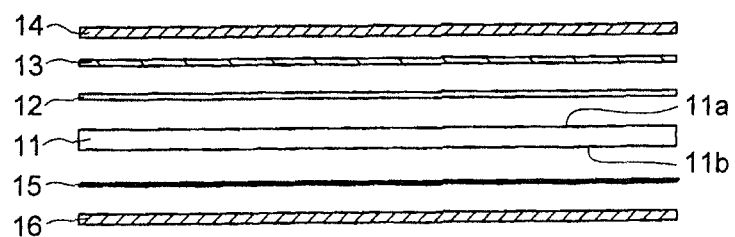
FIGS. 2A to 2M are cross-sectional views of a resistance element according to a first embodiment in the course of being manufactured.

Firstly, as depicted in FIG. 2A, a resin base 11 is prepared which has a thickness of 0.1 mm and is made of glass epoxy resin. The resin base 11 having no conductive layer formed on any of both surfaces is also called an unclad board.

Then, on a main surface 11a, which is one surface of the resin base 11, an insulating layer 12, a resistor layer 13 and a conductive layer 14 are stacked in this order. Here, the insulating layer 12 is made of pre-preg having a thickness of approximately 0.1 mm, the resistor layer 13 has a thickness of approximately 35 µm, and the conductive layer 14 has a thickness of approximately 35 µm.

Among these layers, as the resistor layer 13, Ohmega-Ply (manufactured by Ohmega Technologies, Inc.) which is a Ni—P alloy foil having a sheet resistance of 50Ω/□ can be used, for example. As the conductive layer 14, a copper foil having a sheet resistance lower than that of the resistor layer 13 can be used.

Meanwhile, on the other surface 11b of the resin base 11, an insulating layer 15 and a conductive layer 16 are stacked in this order. Here, the insulating layer 15 is made of pre-preg having a thickness of approximately 0.1 mm, and the conductive layer 16 is made of copper having a thickness of approximately 35 μm.

Figure 2B:
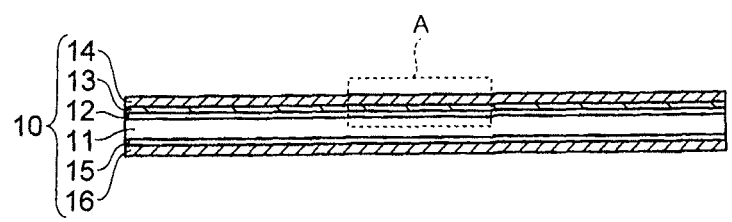

Thereafter, vacuum press is performed on the layers 11 to 16 under the condition that the heating temperature is 180° C. and the pressure is 3 MPa. Thereby, a laminated plate 10 as illustrated in FIG. 2B is formed.

The subsequent steps will be described with reference to enlarged views of a partial region A in FIG. 2B.

Figure 2C:
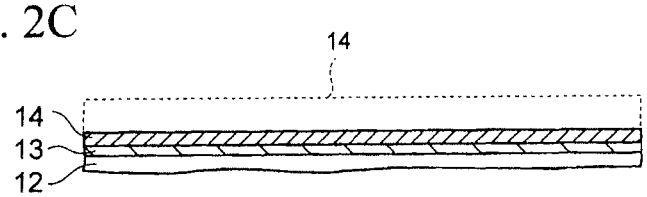

Firstly, as depicted in FIG. 2C, an entire surface of the conductive layer 14, made of copper, is half-etched by using an etching solution including copper chloride, to reduce the thickness of the conductive layer 14 to as thin as 10 μm.

Figure 2D:
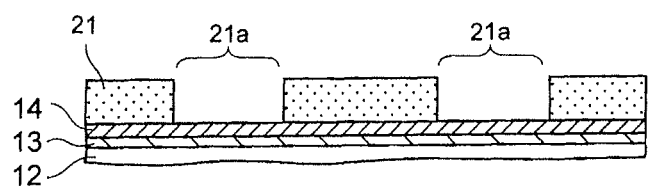

Thereafter, as illustrated in FIG. 2D, a dry film resist is laminated to an upper surface of the conductive layer 14, and, by exposing and developing the dry film resist, a first resist pattern 21 including first windows 21a is formed.

Figure 2E:
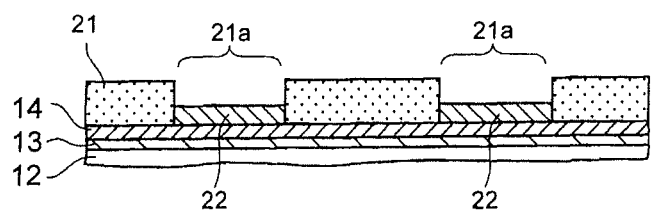

Subsequently, as depicted in FIG. 2E, a copper film is selectively grown on a portion, in each of the first windows 21a, of the conductive layer 14 to have a thickness of approximately 10 μm by an electroplating method, while the conductive layer 14 is being used as a power supply layer. Thereby, first electrode patterns 22 made of copper are formed.

Thereafter, the first resist pattern 21 is removed.

Figure 2F:
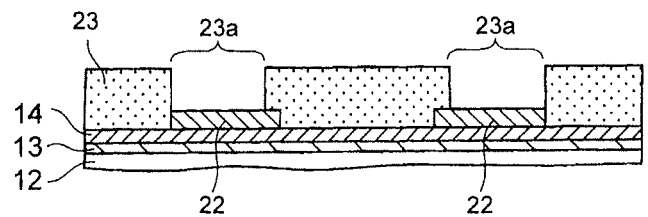

Then, as depicted in FIG. 2F, a dry film resist is laminated to the first electrode patterns 22 and the conductive layer 14, and, by exposing and developing the dry film resist, a second resist pattern 23 is formed.

The second resist pattern 23 includes second windows 23a respectively over the first electrode patterns 22. Here, the second windows 23a are each formed smaller in area than each of the first electrode patterns 22.

Figure 2G:
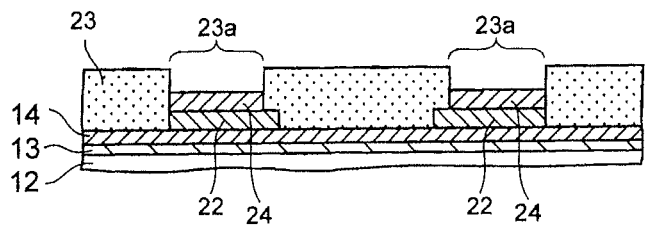

Subsequently, as depicted in FIG. 2G, a copper film is selectively grown on a portion, in the second windows 23a, of each of the first electrode patterns 22 to have a thickness of approximately 10 μm by an electroplating method, while the first electrode pattern 22 is being supplied with power. Thereby, second electrode patterns 24, each made of a copper film, are formed.

Figure 2H:
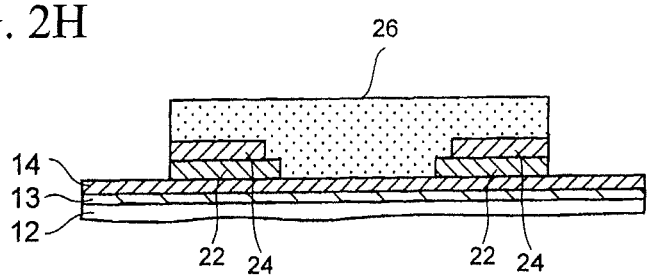

Next, a step performed to obtain a cross-sectional structure illustrated in FIG. 2H will be described.

Firstly, a dry film resist is laminated to the entire upper surface of the conductive layer 14. By exposing and developing the dry film resist, a third resist pattern 26 is formed in such a resist pattern shape as to cover the top surfaces of the respective electrode patterns 22 and 24.

Figure 2I:
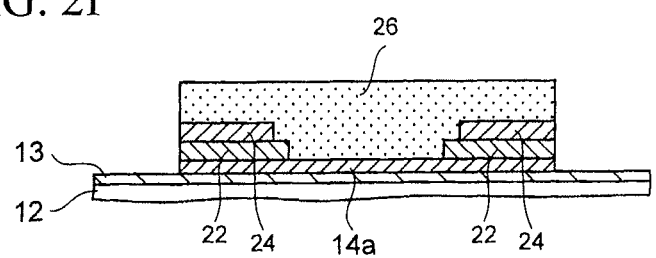

Then, as depicted in FIG. 2I, wet etching is performed on the conductive layer 14 by using the third resist pattern 26 as a mask. Thereby, conductive patterns 14a are formed. Although an etching solution used in this wet etching is not particularly limited, an etching solution including copper chloride is used in this embodiment.

Here, the conductive layer 14 before the etching is thinned by the half-etching depicted in FIG. 2C. Accordingly, etching in the lateral directions of the conductive patterns 14a hardly progresses in this step, hence etching accuracy is improved. This makes it possible to reduce variation in outer shape among the conductive patterns 14a, and to obtain the conductive pattern 14a having an outer shape close to a design layout.

Figure 2J:
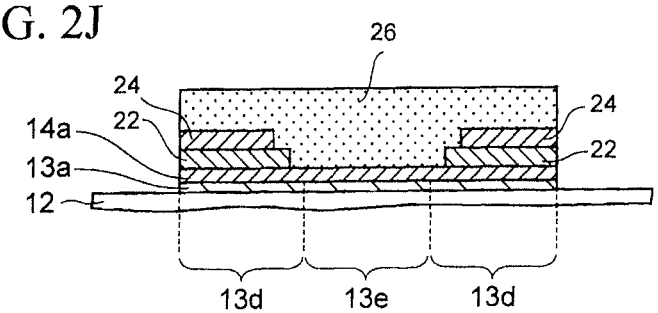

Thereafter, as depicted in FIG. 2J, wet etching is performed on the resistor layer 13 by using a mixed liquid of nitric acid and muriatic acid as an etching solution and the conductive patterns 14a as a hard mask. Thereby, resistance patterns 13a are formed.

In this wet etching, since the conductive patterns 14a are formed so as to reduce variation in outer shape as described above, the outer shape of each of the resistance patterns 13a, formed by using the conductive pattern 14a as a mask, is also stably formed.

The resistance pattern 13a thus formed includes electrode portions 13d, above each of which the first electrode pattern 22 is formed; and an extending portion 13e, which extends in the lateral directions of the base 11 (see FIG. 2B) from the electrode portions 13d.

Thereafter, the third resist pattern 26 is removed.

Figure 2K:
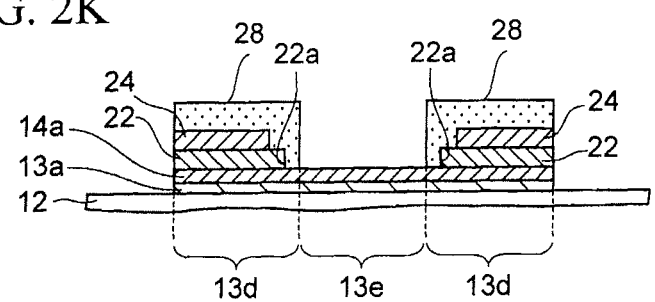

Subsequently, as depicted in FIG. 2K, a dry film resist is laminated to an entire upper surface of the insulating layer 12, and, by exposing and developing the dry film resist, fourth resist patterns 28 each of which covers a side surface 22a, closer to the extending portion 13e, of the corresponding one of the first electrode patterns 22, and a top surface of the first electrode pattern 22.

Figure 2L:
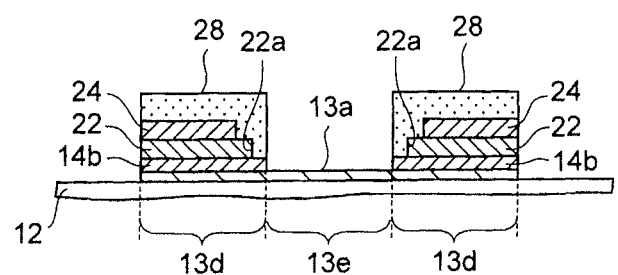

Then, as depicted in FIG. 2L, wet etching is performed on the conductive pattern 14a by using the fourth resist patterns 28 as masks. Thereby, third electrode patterns 14b are formed respectively on the electrode portions 13d.

Since the fourth resist patterns 28 cover respectively the side surfaces 22a of the first electrode patterns 22 during this wet etching, the third electrode patterns 14b each have a shape extending toward the extending portion 13e compared to the corresponding one of the first electrode patterns 22.

Figure 2M:
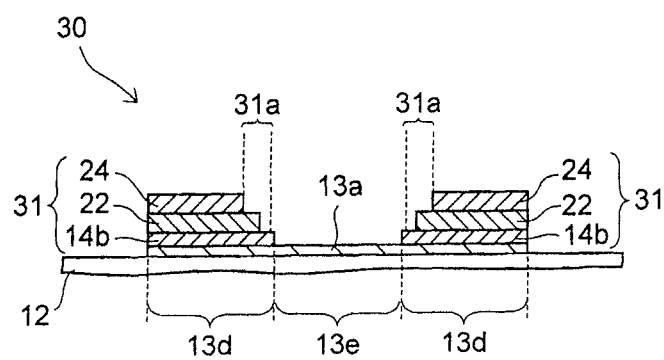

Thereafter, as depicted in FIG. 2M, the fourth resist patterns 28 are removed, and thereby the basic structure of a resistance element 30 is completed.

The resistance element 30 includes electrodes 31 each including the corresponding ones of the electrode patterns 14b, 22 and 24. In the resistance element 30, current is supplied to the resistance pattern 13a from the electrodes 31. The electrodes 31 are made of copper having a sheet resistance lower than that of the resistance pattern 13a made of Ni—P alloy. Accordingly, the resistance value of the entire resistance element 30 is substantially determined by the resistance value of the resistance pattern 13a.

Each of the electrodes 31 is formed of the electrode patterns 14b, 22 and 24 in tiers, and thus has a foot portion 31a reduced in thickness stepwise from the corresponding one of the electrode portions 13d toward the extending portion 13e.

Figure 3:
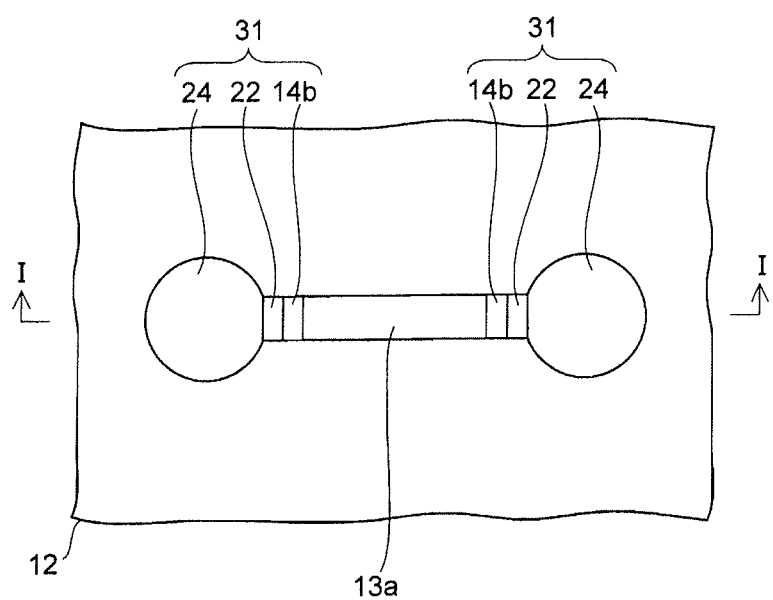
FIG. 3 is a top view of the resistance element according to the first embodiment.

FIG. 3 is a top view of the resistance element 30, and FIG. 2M preceding the FIG. 3 corresponds to a cross-sectional view of the resistance element 30 taken along a line I-I in FIG. 3.

According to the above-described embodiment, the conductive layer 14 is etched in advance to be a thin film in the step illustrated in FIG. 2C. Accordingly, in the wet etching of such thin conductive layer 14 in the step illustrated in FIG. 2I, etching in the lateral directions hardly progresses. Hence, the conductive patterns 14a having outer shapes reduced in variation can be obtained. For this reason, in forming the resistance patterns 13a by the wet etching using the conductive patterns 14a as a mask in the step illustrated in FIG. 2J, the resistance patterns 13a inherits the stable outer shape of the conductive patterns 14a, thus reducing the variation in outer shape among the resistance patterns 13a.

In this way, the resistance pattern 13a has a stable resistance value, and consequently the resistance element 30 whose resistance value is highly reliably stable can be obtained.

In addition, as illustrated in FIG. 2M, each of the electrodes 31 of the resistance element 30 includes the foot portion 31a, and the foot portion 31a is reduced in film thickness from the corresponding one of the electrode portion 13d toward the extending portion 13e. With this structure, volume variation of the electrodes 31 along with temperature fluctuation is reduced in the foot portions 31a. This reduces stress applied to portions, near the foot portions 31a, of the resistance pattern 13a attributable to the difference in thermal expansion coefficient between the resistance pattern 13a and the electrodes 31. Thereby, it is possible to prevent snapping of the resistance pattern 13a due to stress, and to increase in reliability of the resistance element 30.

Second Embodiment

In the first embodiment, the foot portions 31a of the electrodes 31 are each formed in tiers as illustrated in FIG. 2M. In the second embodiment, by contrast, the foot portions 31a are made inclined in the following way.

Figure 4A:
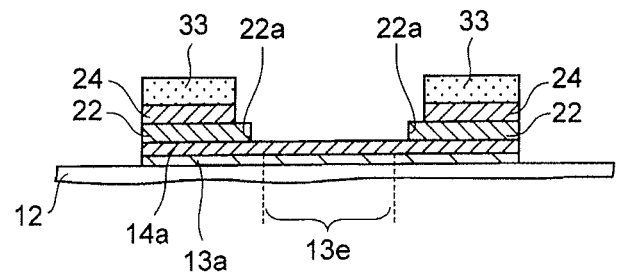
FIGS. 4A to 4C are cross-sectional views of a resistance element according to a second embodiment in the course of being manufactured.
Figure 4B:
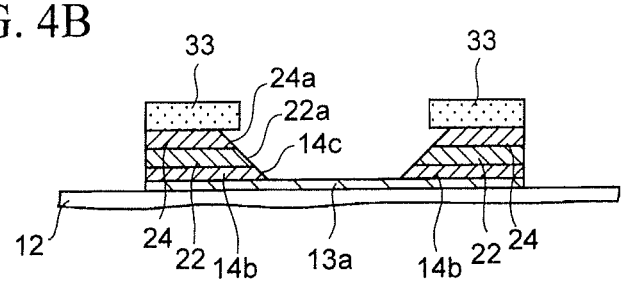
Figure 4C:
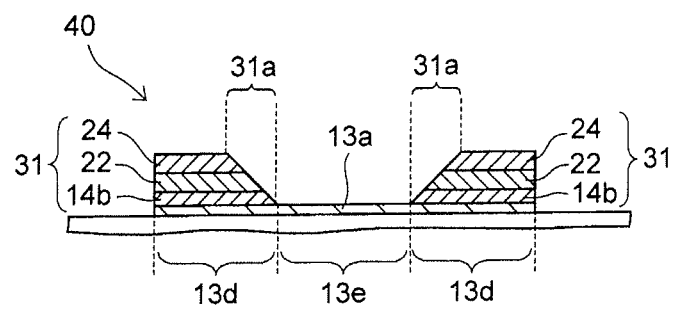

FIGS. 4A to 4C are cross-sectional views of a resistance element according to this embodiment in the course of being manufactured. It is to be noted that, in FIGS. 4A to 4C, the same components as those in the first embodiment are denoted by the same reference numerals used in the first embodiment, and that explanations of the components are omitted below.

To manufacture the resistance element according to this embodiment, firstly, the steps described in the first embodiment with reference to FIGS. 2A to 2J are performed.

Then, as depicted in FIG. 4A, a dry film resist is laminated to an entire upper surface of an insulating layer 12, and, by exposing and developing the dry film resist, fifth resist patterns are formed respectively on second electrode patterns 24.

The fifth resist patterns 33 are each formed from a position spaced from a side surface 22a, closer to an extending portion 13e, of a corresponding one of first electrode patterns 22.

Then, as illustrated in FIG. 4B, wet etching is performed on a conductive pattern 14a by using the fifth resist patterns 33 as masks, and an etching solution including copper chloride. Thereby, third electrode patterns 14b are formed.

In this wet etching, side surfaces 14c, 22a and 24a, not covered with the fifth resist patterns 33, of the electrode patterns 14b, 22 and 24 are also subjected to wet etching. Since etching progresses isotoropically in wet etching, the side surfaces 14c, 22a and 24a are made inclined as illustrated in FIG. 4B.

Thereafter, as depicted in FIG. 4C, the fifth resist patterns 33 are removed, and thereby a basic structure of a resistance element 40 is completed.

The resistance element 40 includes electrodes 31 each including the corresponding ones of the electrode patterns 14b, 22 and 24 for supplying current to the resistance pattern 13a. A side surface of the electrode 31 is made inclined by the wet etching illustrated in FIG. 4B, and includes a foot portion 31a continuously reduced in thickness from the corresponding one of electrode portions 13d toward the extending portion 13e.

Figure 5:
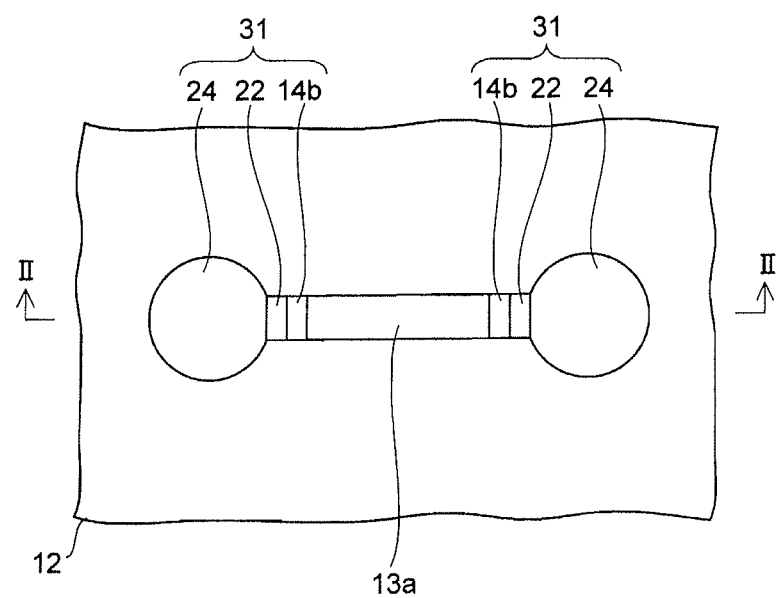
FIG. 5 is a top view of the resistance element according to the second embodiment.

Here, FIG. 5 is a top view of the resistance element 40, and FIG. 4C preceding FIG. 5 corresponds to a cross-sectional view of the resistance element 40 taken along a line II-II in FIG. 5.

According to the above-described embodiment, as in the case of the first embodiment, the foot portion 31a of each of the electrodes 31 is reduced in thickness from the corresponding electrode portion 13d toward the extending portion 13e. This structure reduces stress applied to portions, near the foot portions 31a, of the resistance pattern 13e due to the difference in thermal expansion coefficient between the resistance pattern 13a and the electrodes 31. Consequently, it is possible to reduce a possibility that the resistance pattern 13a snaps due to stress, and to increase reliability of the resistance element 40.

Third Embodiment

Described in this embodiment is a circuit board including the resistance element formed in the first embodiment or the second embodiment.

Figure 6:
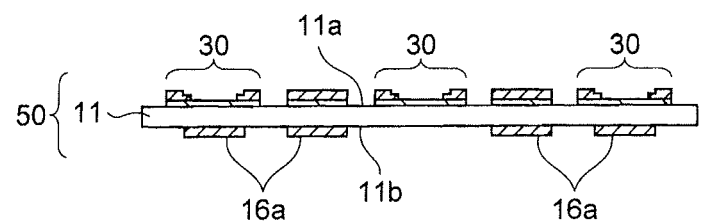
FIG. 6 is a cross-sectional view of a resistor layer used in a third embodiment.

FIG. 6 is a cross-sectional view of a resistor layer used in the circuit board according to this embodiment. It is to be noted that, in FIG. 6, the same components as those in the first embodiment are denoted by the same reference numerals used in the first embodiment, and that explanations of the components are omitted below.

A resistor layer 50 according to this embodiment is manufactured by performing the steps illustrated in FIGS. 2A to 2M described in the first embodiment. On a main surface 11a of a resin base 11, the above-described resistance element 30 is formed.

On the other main surface 11b, including no resistance element 30 formed thereon, of the resin base 11, wiring patterns 16a are formed by patterning a conductive layer 16 (see FIG. 2B).

Here, instead of the resistance element 30 of the first embodiment, the resistance element 40 of the second embodiment (see FIG. 4C) may be formed in the resistor layer 50.

FIGS. 7A to 7D are cross-sectional views of a wiring layer in the course of being manufactured, the wiring layer being to be stacked together with the resistor layer 50.

Figure 7A:
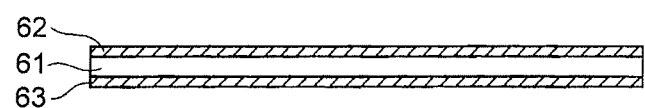
FIGS. 7A and 7D are cross-sectional views of a wiring layer used in the third embodiment in the course of being manufactured.

To form the wiring layer, firstly, first and second conductive layers 62 and 63 are laminated respectively to both surfaces of a resin base 61 made of glass epoxy resin, as depicted in FIG. 7A. As each of the conductive layers 62 and 63, a copper foil having a thickness of approximately 35 μm can be used, for example.

Figure 7B:
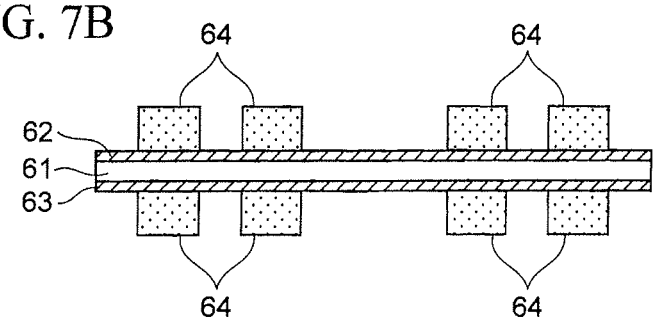

Then, as depicted in FIG. 7B, dry film resists are attached respectively to the conductive layers 62 and 63, and by exposing and developing the dry film resists, resist patterns 64 are formed.

Figure 7C:
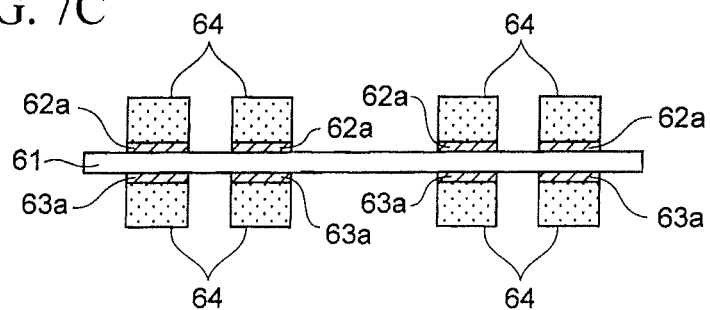

Subsequently, as depicted in FIG. 7C, wet etching is performed on the conductive layers 62 and 63 by using the resist patterns 64 as masks, and an etching solution including copper chloride. Thereby, first and second wiring patterns 62a and 63a are formed.

Figure 7D:
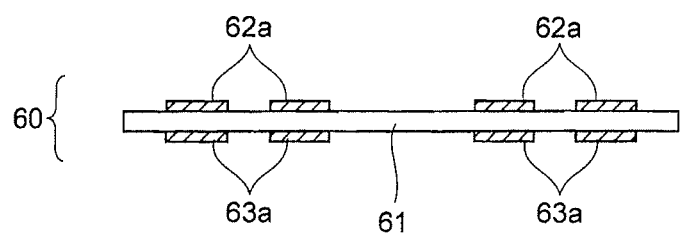

Thereafter, as depicted in FIG. 7D, the resist patterns 64 used as masks are removed, and thereby a basic structure of a wiring layer 60 is obtained.

Next, description continues to the step of stacking the wiring layer 60 thus formed and the above-described resistor layer 50 (see FIG. 6).

FIGS. 8A to 8F are cross-sectional views of a circuit board in the course of being manufactured, the circuit board including the resistor layer 50 and the wiring layers 60.

Figure 8A:
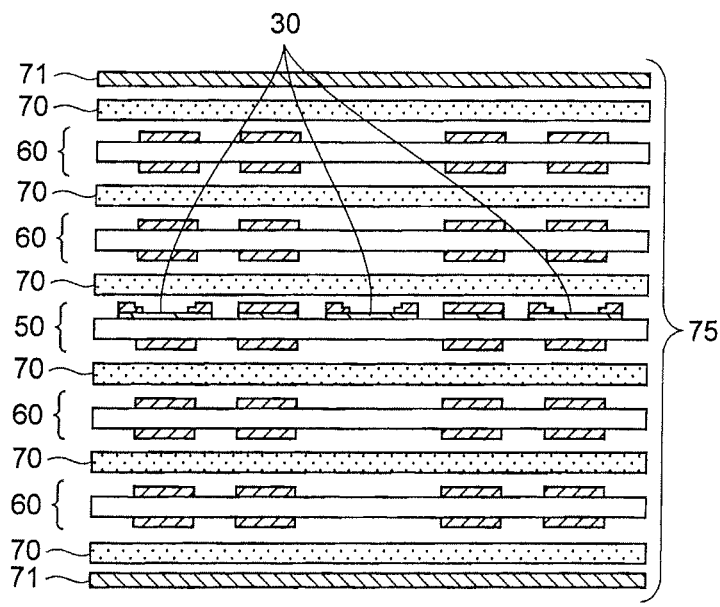
FIGS. 8A to 8F are cross-sectional views of a circuit board according to the third embodiment in the course of being manufactured.

Firstly, as depicted in FIG. 8A, the resistor layer 50, the wiring layers 60 and insulating layers 70 are stacked on one another with the insulating layers 70 interposed between the resistor layer 50 and the wiring layers 60. Thereby, a laminated body 75 is manufactured. As each of the insulating layers 70, an insulting pre-preg having a thickness of approximately 100 μm can be used, for example.

In addition, as an uppermost layer and a lowermost layer of the laminated body 75, copper foils, each having a thickness of approximately 35 µm, are respectively provided. Here, the copper foils serve as conductive layers 71.

Figure 8B:
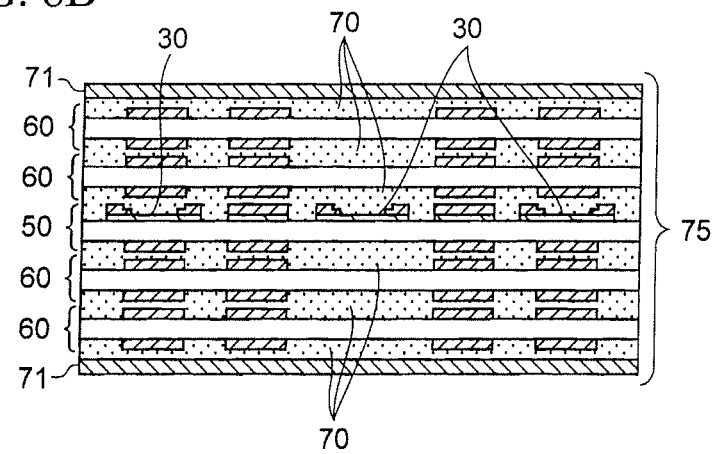

Then, as depicted in FIG. 8B, the laminated body 75 is pressed by vacuum press under the condition that the heating temperature is 185° C. Thereby, the layers 50, 60, 70 and 71 are formed into one unit.

Figure 8C:
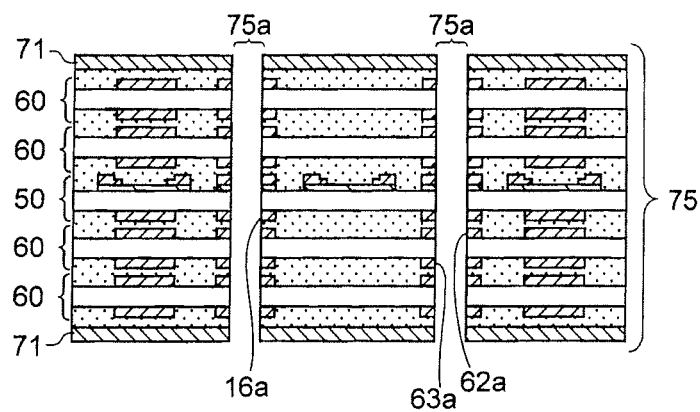

Subsequently, as depicted in FIG. 8C, through-holes 75a are formed in the laminated body 75 by drilling, and thereby the wiring patterns 16a, 62a and 63a are exposed to an inner surface of each of the through-holes 75a.

Figure 8D:
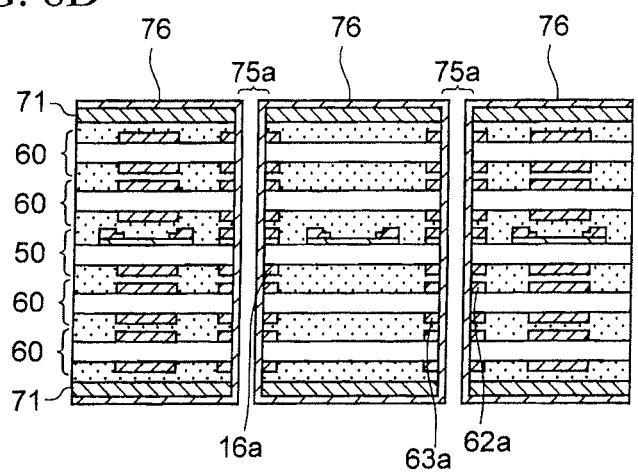

Thereafter, as depicted in FIG. 8D, electroless copper plating layers are formed respectively in the through-holes 75, and then electroplating is performed by using the electroless copper plating layers as power-supply layers. Thereby, plating layers 76 are formed in the through-holes 75a and on the conductive layers 71.

By the plating layers 76, the wiring patterns 16a, 62a and 63a exposed to the through-holes 75a are electrically connected to each other.

Figure 8E:
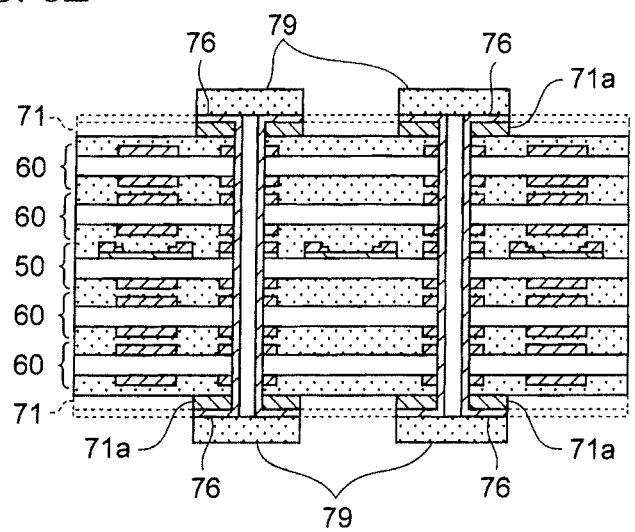

Then, as depicted in FIG. 8E, resist patterns 79 are formed respectively on the plating layers 76, the resist patterns 79 obtained by exposing and developing dry film resists. Wet etching is performed on the layers 71 and 76 by using the resist patterns 79 as masks. Thereby, wirings 71a are formed.

Figure 8F:
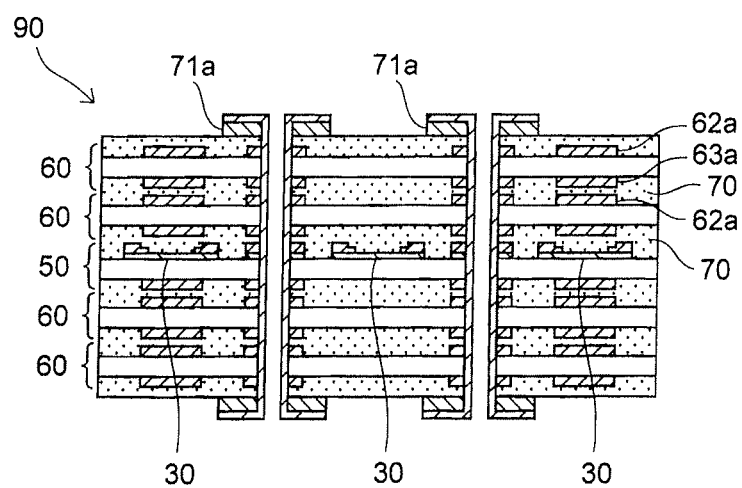

Thereafter, the resist patterns 79 are removed, and thereby a basic structure of a circuit board 90 according to this embodiment is completed as depicted in FIG. 8F.

The circuit board 90 is a multi-layer wiring substrate in which the wiring patterns 62a and 63a and the insulating layer 70 are alternately stacked in multiple stages on each resistance element 30.

According to the above-described embodiment, the laminated body 75 is heated when the laminated body 75 is pressed in the step illustrated in FIG. 8B. Even if the laminated body is thus heated, snapping of the resistor pattern 13 is less likely to occur as described in the first embodiment, since the foot portions 31a (see FIG. 2M) are provided to the electrodes 31 of the resistance element 30. Accordingly, in this embodiment, the resistance element 30 is less likely to be defective even if undergoing the heating step, and hence the circuit board 90 maintaining reliability can be provided.

Hereinabove, the third embodiment has been described in detail. However, this embodiment is not limited to what is described above. For example, although the resistance elements 30 or 40 are formed between the layers of the multi-layer wiring board in the above description, the resistance elements 30 or 40 may be formed on a flexible circuit board.

Fourth Embodiment

In this embodiment, as in the third embodiment, the resistance element manufactured in the first embodiment or the second embodiment is applied to a circuit board.

In this embodiment, however, a material mainly including carbon fibers is used for a core substrate of the circuit board as described in the following, the carbon fibers having a thermal expansion coefficient smaller than that of resin.

FIGS. 9A to 9K are cross-sectional views of the circuit board according to this embodiment in the course of being manufactured. It is to be noted that, in FIGS. 9A to 9K, the same components as those in the first to third embodiments are denoted by the same reference numerals used in the embodiments, and that explanations of the components are omitted below.

Figure 9A:
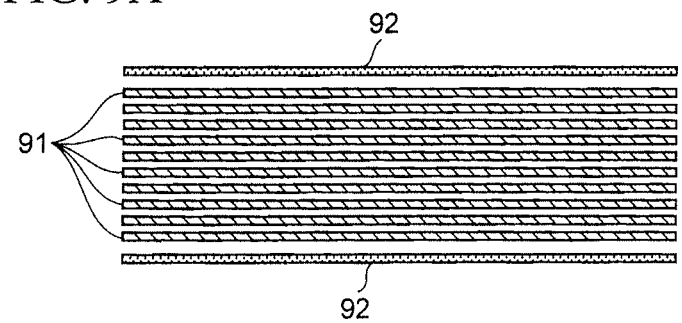
FIGS. 9A to 9K are cross-sectional views of a circuit board according to a fourth embodiment in the course of being manufactured.

Firstly, as depicted in FIG. 9A, ten carbon fiber pre-pregs 91 are stacked, and insulating pre-pregs 92 are disposed respectively on an upper and lower surfaces of the resultant stacked body. Here, each of the carbon fiber pre-pregs 91 is made of a woven cloth of carbon fibers impregnated with epoxy resin and has a thickness of approximately 0.2 mm, while each of the insulating pre-pregs 92 has a thickness of approximately 100 µm.

Figure 9B:
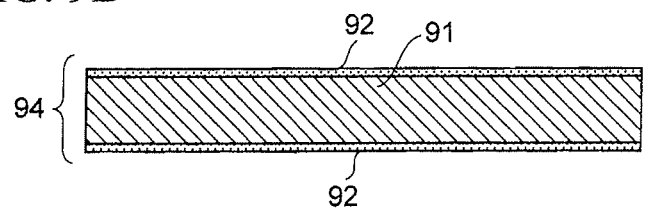

Then, as depicted in FIG. 9B, vacuum press is performed on the pre-pregs 91 and 92 in an unillustrated die under the condition that the pressure is 3 MPa, the temperature is 180° C., and the pressing time is one hour. Thereby, a composite core substrate 94 having a thickness of approximately 2 mm is manufactured.

Figure 9C:
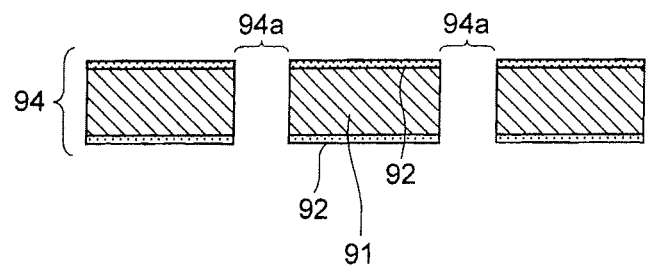

Thereafter, as depicted in FIG. 9C, openings 94a are formed in the composite core substrate 94 by drilling. Although not particularly limited, the diameter of each of the openings 94a is preferably larger than that of through-holes to be described later, and is set at approximately 0.8 mm in this embodiment.

Figure 9D:
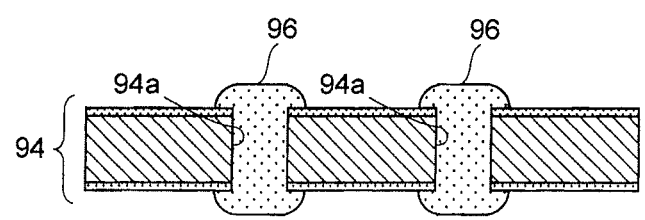

Subsequently, as depicted in FIG. 9D, a thermosetting insulating resin 96 is filled in each of the openings 94a, and is then thermoset by heating.

Figure 9E:
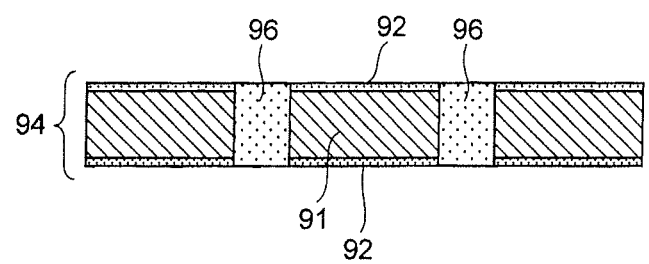

Thereafter, as depicted in FIG. 9E, portions, running off the edges of the openings 94a, of the insulating resins 96 are removed by polishing.

Figure 9F:
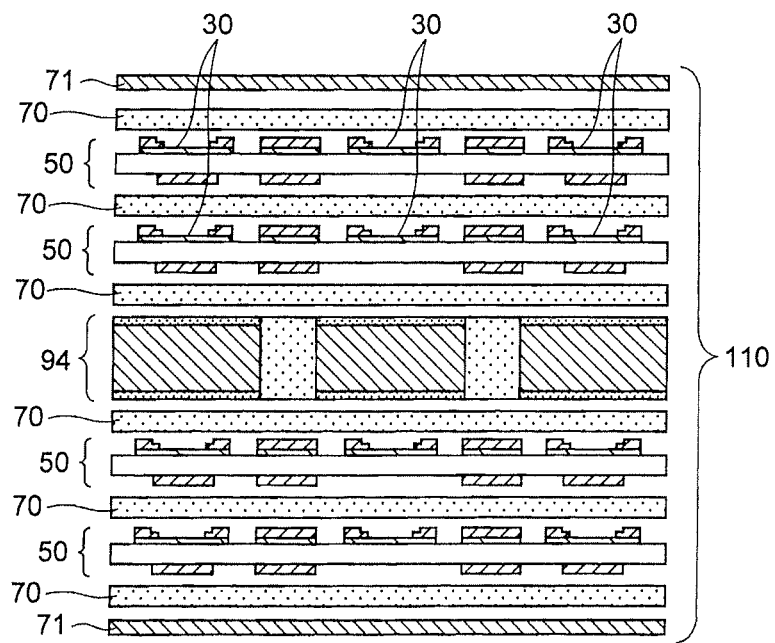

Then, as depicted in FIG. 9F, resistor layers 50, insulating layers 70 and conductive layers 71, described in the third embodiment, are prepared, and are stacked with the composite core substrate 94 in the middle as depicted in FIG. 9F. Thereby, a laminated body 110 is manufactured. In the laminated body 110, a resin base 11 (see FIG. 6) of each of the resistor layers 50 is formed above the core board 94.

Figure 9G:
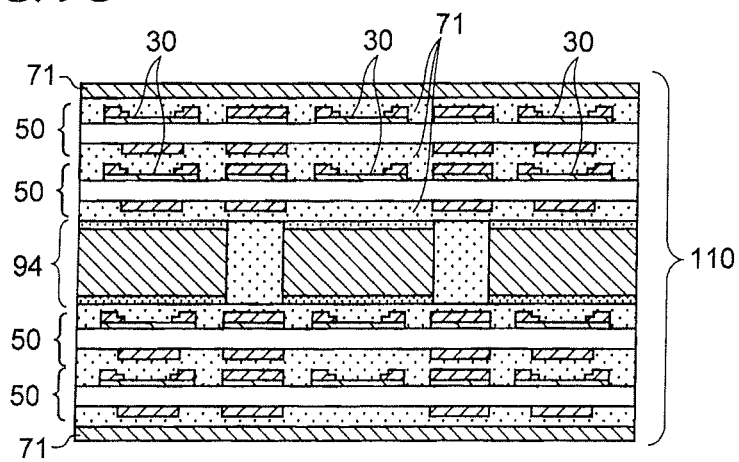

Subsequently, as depicted in FIG. 9G, the laminated body 110 is pressed by vacuum press under the condition that the heating temperature is 185° C. Thereby, the composite core board 94 and the layers 50, 70 and 71 are formed into one unit.

Figure 9H:
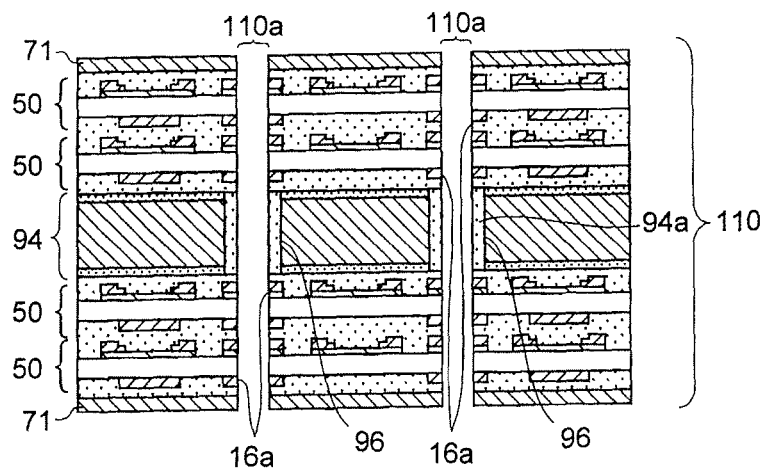

Then, as depicted in FIG. 9H, through-holes 110a are formed in the laminated body 110 so that the thorough-holes 110a would respectively pass the insulating resins 96. Wiring patterns 16a of the resistor layers 50 are caused to be exposed to inner surfaces of the through-holes 110a. The through-holes 110a are formed by drilling. The diameter of each of the through-holes 110a is smaller than that of the openings 94a of the composite core board 94, and is approximately 0.35 mm, for example.

Figure 9I:
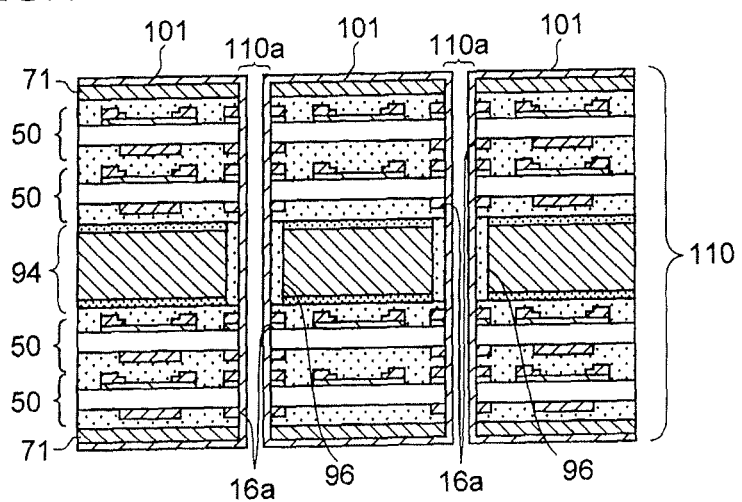

Thereafter, as depicted in FIG. 9I, an electroless copper plating layer is formed on an inner surface of each of the through-holes 110a, and then electroplating is performed by using the electroless copper plating layers as power supply layers. Thereby, plating layers 101 are formed on the inner surfaces of the through-holes 110a and the conductive layers 71.

By the plating layers 101, wiring patterns 16a, exposed to the through-holes 110a, are electrically connected to each other.

Here, since the composite core substrate 94 is separated from the plating layers 101 by the insulating resins 96, the conductive carbon fibers included in the core substrate 94 are prevented from being electrically connected to the plating layers 101.

Figure 9J:
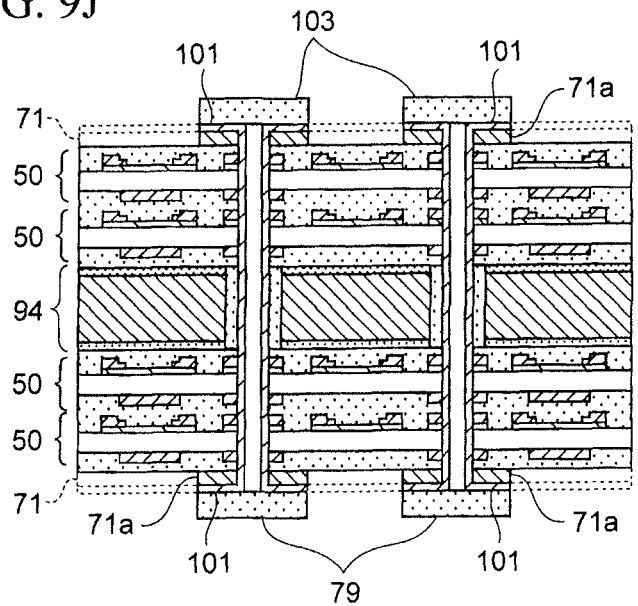

Then, as depicted in FIG. 9J, a resist pattern 103 is formed on the plating layers 101, and wet etching is performed on the layers 71 and 101 by using the resist pattern 103 as a mask, the resist pattern 103 being obtained by exposing and developing a dry film resist. Thereby, wirings 71a are formed.

Figure 9K:
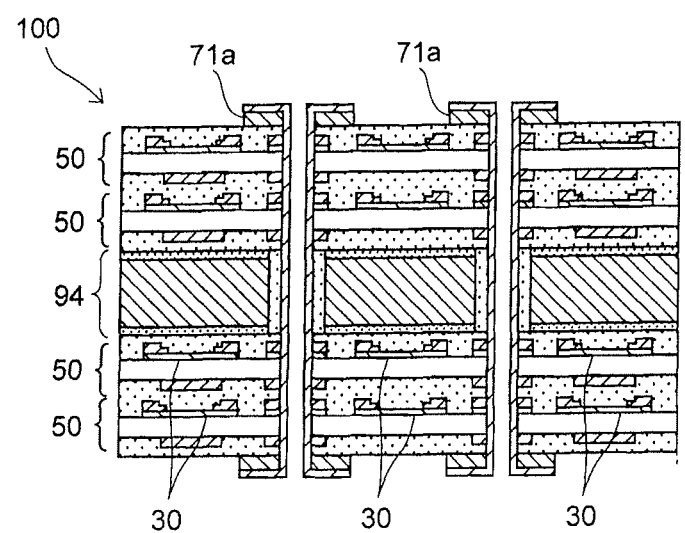

Thereafter, the resist pattern 103 is removed. Thereby, a basic structure of a circuit board 100 according to this embodiment as depicted in FIG. 9K is completed.

According to the above-described fourth embodiment, the composite core substrate 94 is manufactured by using the carbon fiber pre-pregs 91 as depicted in FIGS. 9A to 9B. The thermal expansion coefficient of the circuit board 100 including the composite core substrate 94 having such a structure is typically a small value which is 10 ppm/° C. or smaller, while varying depending on the film thickness and material of each of the layers 50, 70 and 71. This value is smaller than that of a resin substrate formed of pre-pregs made of glass fibers impregnated with epoxy resin.

By contrast, the thermal expansion coefficient of copper included in each of the electrodes 31 (see FIG. 2M) of the resistance element 30 is approximately 17 ppm/° C., and is thus a large value compared with the thermal expansion coefficient of the circuit board 100 (10 ppm/° C. or smaller). Hence, in the case of using carbon fibers in the composite core substrate 94, the difference in thermal expansion coefficient between the circuit board 100 and the resistance element 30 is prominent, and the resistance element 30 receives a large amount of stress from its surrounding due to the difference in thermal expansion coefficient.

However, in this embodiment, the foot portions 31a (see FIG. 2M) are provided to the electrodes 31 of the resistance element 30. Accordingly, even when the resistance element 30 receives such stress, the stress can be dispersed around the foot portions 31a, and the stress applied to the resistance pattern 13a can be reduced.

With this configuration, the possibility of snapping of the resistance pattern 13a due to stress can be reduced, and the defective rate of the circuit board 100 can be reduced, even in the case of using the composite core substrate 94 whose thermal expansion coefficient is reduced due to carbon fibers.

Here, a material usable for the composite core substrate 94 is not limited to carbon fibers, and Invar alloy plates may be used instead of the carbon fiber pre-pregs 91 (see FIG. 9A). Invar alloy is an Fe—Ni alloy, and has the smallest thermal expansion coefficient when the concentration of nickel in the alloy is approximately 36%. Thus, Invar alloy also has a small thermal expansion coefficient, and is hence useful in reducing stress to be applied to the resistance pattern 31a by providing the foot portions 13a.

Incidentally, the stress applied to the resistance pattern 13a is considered to be dependent on the inclination of each of the foot portions 31a.

FIG. 10 is a cross-sectional view for explaining preferable inclination of the foot portion 31a. In FIG. 10, the same components as those described with reference to FIG. 2M in the first embodiment are denoted by the same reference numerals as those used in the first embodiment, and explanations of the components are omitted in the following.

In FIG. 10, the height of the electrode 31 is denoted by T, the length of the foot portion 31a is denoted by L, and the inclination of the foot portion 31a with respect to a main surface of the resistance pattern 13a is denoted by θ.

To reduce the stress to be applied to the resistance pattern 13a, it is preferable that T/L, which is the tangent of the inclination θ of the foot portion 31a, be set as small as possible, and preferably T/L<1.

In particular, in the case of using the circuit substrate 100 having a small thermal expansion coefficient which is 10 ppm/° C. or smaller as in this embodiment, the difference in thermal expansion coefficient between the resistance element 30 and the circuit board 100 is large. Accordingly, it is preferable to set T/L even smaller, for example, T/L<0.6.

Here, assume a case of using a circuit board formed of a composite material made of glass fibers and epoxy resin. In such a case, it may seem that stress is not applied to the resistance element 30 if the thermal expansion coefficients of the circuit board and the resistance element 30 are substantially the same. However, warping occurs in the circuit board due to the heat history at the time of manufacturing, and stress is applied to the resistance element 30 due to the warping. For this reason, even in such a case, it is preferable to set T/L<1 as in the above-described case.

Next, the defective rate of the resistance element 30 investigated by the inventor of this application would be described.

In this investigation, the circuit board 100 manufactured according to this embodiment is used. The thermal expansion coefficient of the circuit board 100 is 6 ppm/° C., and the tangent T/L of the inclination of each of the foot portions 31a is set at 0.6. The tangent corresponds to inclination of approximately 30°.

In addition, in order to confirm the effects obtained by providing the foot portions 31a, the circuit board 100 in which L=0 and no foot portions 31a are provided is manufactured as a comparative example, and the defective rate of the comparative example is also investigated.

The results are illustrated in Table 1 below.

TABLE 1

| | | Comparative example | Present embodiment |
|---|---|---|---|
| Shape of electrode 31 | | Without foot portion 31a | With foot portion 31a |
| The total number of resistance patterns 30 | | 12,894 | 12,894 |
| Snapping of resistance pattern 13a | The number of occurrences (%) | 29 0.2 | 0 0 |
| Increase of resistance value (increase from design value exceeds 30% of deign value) | The number of occurrences (%) | 152 1.2 | 0 0 |
| The number of defectives | | 181 | 0 |
| Defective rate | | 1.4 | 0 |

As depicted in Table 1, 12,894 resistance elements 30 are manufactured in the circuit 100 in this investigation.

In the comparative example provided with no foot portions 31a, snapping of the resistance pattern 13a occurred in 29 out of the 12,894 resistance elements 30, and the resistance value was increased from the design value by 30% or more in 152 out of the 12,894 resistance elements 30.

Accordingly, in the comparative example, the total number of defects was 181 (=29+252), and the defective rate was 1.4%.

By contrast, in this embodiment, no resistance element 30 was found in which snapping of the resistor pattern 13a occurred or the resistor value was larger than the design value by 30% or more. Accordingly, the defective rate was 0%.

On the basis of these results, it was confirmed that the foot portions 31a were effective in reducing the defective rate of the resistance element 30.

The inventor of this application further investigated, for each of this embodiment and the comparative example, the average value, the maximum value, the minimum value and the standard deviation of the resistance values of the 12,894 resistance elements 30.

The results are depicted in Table 2 below.

TABLE 2

| | | Resistance value Ω | |
| --- | --- | --- | --- |
| | Design value | Comparative example (without foot portion 31a) | Present Embodiment (with foot portion 31a) |
| Average value | 200 | 227.8 | 198.6 |
| Maximum value | 260 | 348.5 | 259.2 |
| Minimum value | 140 | 167.0 | 162.7 |
| Standard deviation | — | 29.7 | 15.4 |

Here, the resistance elements used in the comparative example were manufactured in accordance with FIGS. 1A to 1D in the first embodiment.

As depicted in Table 2, in the comparative example provided with no foot portions 31a, the average value of the resistance values was larger than the design value by 14%, and the standard deviation of the resistance values was 29.7Ω.

By contrast, in this embodiment provided with the foot portions 31a, the obtained resistance values were substantially as designed, although the average value of the resistance values was smaller than the design value by 0.7%. Furthermore, the standard deviation obtained in this embodiment was 15.4Ω, which is smaller than that obtained in the comparative example.

This is considered to be because, in this embodiment, the resistance pattern 13a is formed by using, as a mask, the conductive pattern 14a having an outer shape reduced in variation by the thin-film technique as depicted in FIG. 2J, and hence the patterning accuracy of the resistance pattern 13a of this embodiment is increased compared with the comparative example.

Fifth Embodiment

FIGS. 11A to 11J are cross-sectional views of a resistance element according to this embodiment in the course of being manufactured. FIGS. 11A to 11J are enlarged views of the partial region A in FIG. 2B of the first embodiment. In FIGS. 11A to 11J, the same components as those described in the first embodiment are denoted by the same reference numerals, and explanations of the components are omitted in the following.

Figure 11A:
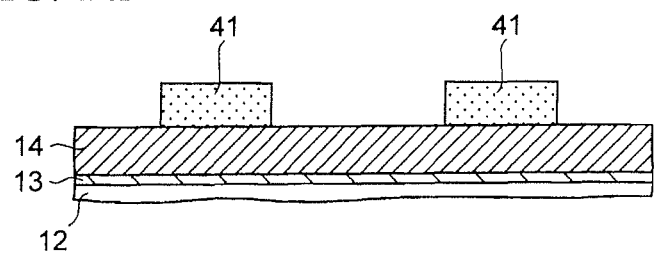
FIGS. 11A to 11J are cross-sectional views of a resistance element according to a fifth embodiment in the course of being manufactured.

To manufacture a circuit board according to this embodiment, the structure illustrated in FIG. 2B is formed according to the first embodiment, and then first resist patterns are formed on portions, to serve as electrodes later, of a conductive layer 14 as depicted in FIG. 11A.

Figure 11B:
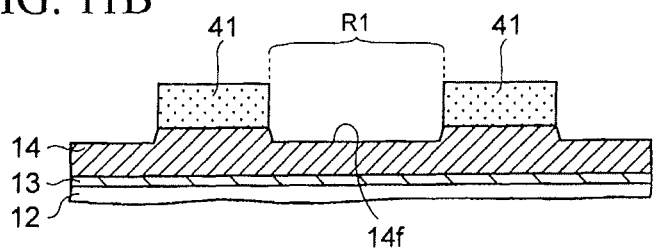

Then, as depicted in FIG. 11B, half etching is performed on the conductive layer 14 made of copper, by using an etching solution including copper chloride.

Thereby, the thickness of a first region R1 of the conductive layer 14 is reduced since the first region R1 is not covered with any of the first resist patterns 41. In this way, a first surface 14f different in level is formed in the conductive layer 14. The height of the first surface 14f is, for example, approximately 20 μm from an upper surface of the resistor layer 13.

After this wet etching, the first resist patterns 41 are removed.

Figure 11C:
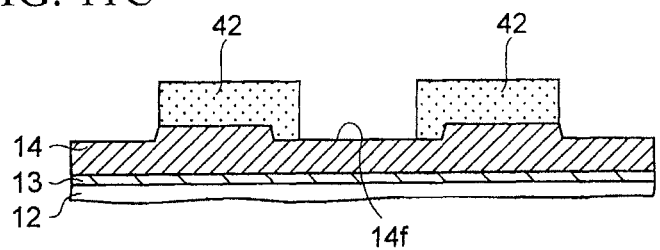

Then, as depicted in FIG. 11C, a dry film resist is attached to an upper surface of the conductive layer 14, and, by exposing and developing the dry film resist, second resist patterns 42 are formed.

Figure 11D:
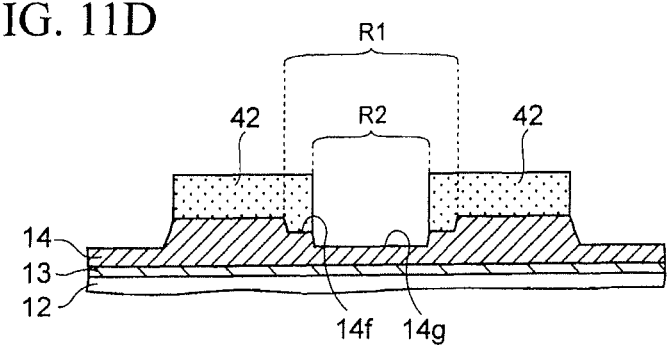

Subsequently, as depicted in FIG. 11D, half etching is performed again on the conductive layer 14 by using the second resist patterns 42 as masks, and an etching solution including copper chloride.

In this etching, a second region R2, included in the first region R1, of the conductive layer 14 is not covered with the second resist patterns 42. Accordingly, the thickness of the region R2 of the conductive layer 14 is reduced by the wet etching, and thereby a second surface 14g different in level than the first surface 14f is formed in the conductive layer 14.

Although the height of the second surface 14g is not particularly limited, the second surface 14g is positioned at a height lower than the first surface 14f, for example, approximately 10 μm over the top surface of the resistor layer 13, in this embodiment.

Thereafter, the second resist patterns 42 are removed.

Figure 11E:
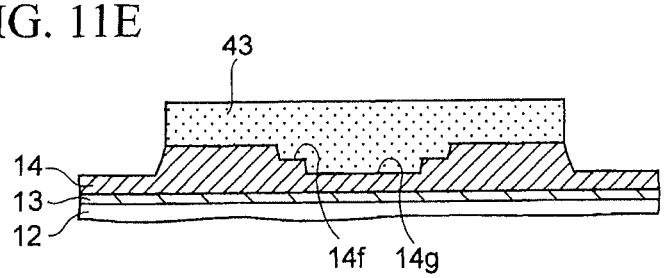

Then, as depicted in FIG. 11E, a dry film resist is attached onto the conductive layer 14 again, and, by exposing and developing the dry film resist, a third resist pattern 43 is formed.

Figure 11F:
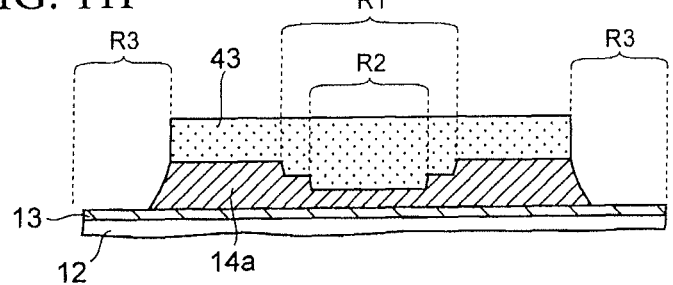

Subsequently, as depicted in FIG. 11F, wet etching is performed on the conductive layer 14 by using the third resist pattern 43 as a mask.

By this wet etching, portions of the conductive layer 14 residing in a third region R3 located outside of the first region R1 and second region R2 are removed. Thereby, the resistor layer 13 is exposed to the region R3, and a conductive pattern 14a made from the portions of the conductive layer 14, remaining without being subjected to etching, is formed.

Here, although the etching solution used in this wet etching is not particularly limited, an etching solution including copper chloride is used in this embodiment.

Figure 11G:
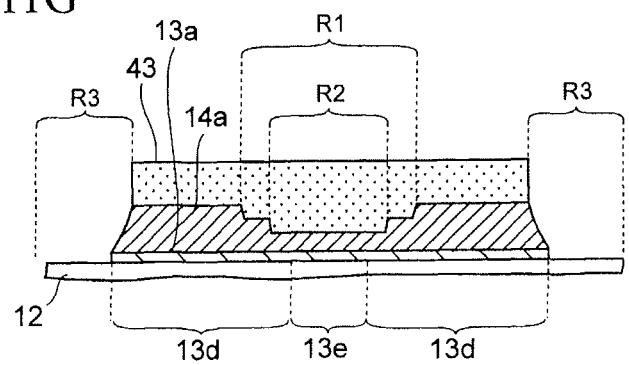

Then, as depicted in FIG. 11G, wet etching is performed on the resistor layer 13 by using the conductive pattern 14a as a hard mask. Thus, a portion of the resistor layer 13, remaining without being subjected to etching, is made into a resistance pattern 13a. In this wet etching, a mixed liquid including nitric acid and muriatic acid is used as an etching solution.

Here, as described in the first embodiment, the resistance pattern 13a includes electrode portions 13d and an extending portion 13e.

Thereafter, the third resist pattern 43 is removed.

Figure 11H:
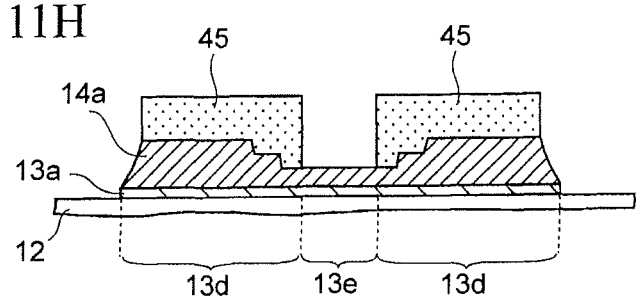

Then, as depicted in FIG. 11H, a dry film resist is attached onto the conductive layer 14, and by exposing and developing the dry film resist, fourth resist patterns 45 are formed on portions, over the electrode portions 13d, of the conductive layer 14.

Figure 11I:
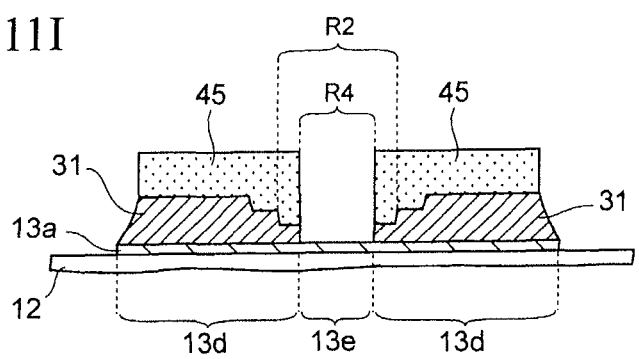

Thereafter, as depicted in FIG. 11I, wet etching is performed on the conductive pattern 14a by using the fourth resist patterns 45 as masks to remove a portion, in a fourth region R4 included in the second region R2, of the conductive pattern 14a. Thus, portions of the conductive pattern 14a, remaining without being subjected to etching, is made into electrodes 31.

In this wet etching, an etching solution including copper chloride is used, for example.

Figure 11J:
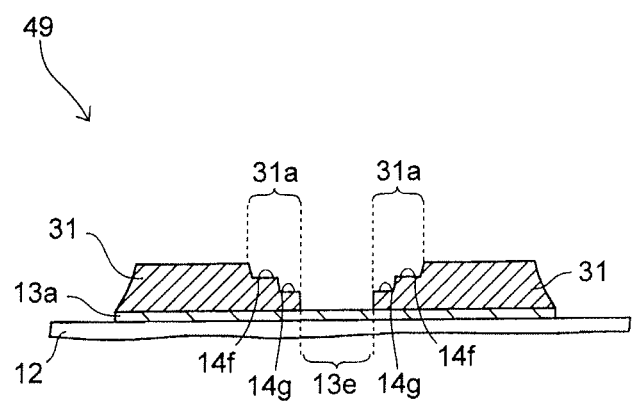

After the wet etching, the fourth resist patterns 45 are removed, and thereby a basic structure of a resistance element 49 according to this embodiment as illustrated in FIG. 11J is completed.

Due to the first surface 14*f* and the second surface 14*g* described above, the electrode 31 of the resistance element 49 has foot portion 31*a* reduced in thickness stepwise from the electrode portions 13*d* to the extending portion 13*e*.

According to the above-described fifth embodiment, as in the first embodiment, volume variation of the electrodes 31 along with temperature fluctuation is reduced in the foot portions 31*a*. This reduces stress applied to portions, near the foot portions 31*a*, of the resistance pattern 13*a*. Thereby, it is possible to prevent snapping of the resistance pattern 13*a* due to stress, and to increase reliability of the resistance element 49.

Moreover, etching is performed on the conductive layer 14 in the two steps, namely, the step of forming the first surface 14*f* (FIG. 11B) and the step of forming the second surface 14*g* (FIG. 11D). Accordingly, an etching amount per each etching steps can be reduced compared with the case of etching the conductive layer 14 at once.

This makes etching hardly progress in the lateral directions in each of the etching steps depicted in FIGS. 11B and 11D, which results in forming the conductive pattern 14*a* having an outer shape reduced in variation.

Accordingly, the resistance pattern 13*a*, formed by etching using the conductive pattern 14*a* as a mask, inherits the stable outer shape of the conductive pattern 14*a*, thus making it possible to obtain the resistance pattern 13*a* having a stable resistance value.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alternations could be made hereto without departing from the spirit and scope of the invention.

What is claimed is:

1. A circuit board comprising:
A core substrate including at least one of a carbon fiber and Invar alloy, wherein a base is formed over the core substrate; and a resistance element formed over the base, wherein the resistance element includes: a resistance pattern including an electrode portion and an extending portion; and an electrode formed on the electrode portion of the resistance pattern and including a foot portion reduced in thickness toward the extending portion, wherein the electrode is formed only on an upper surface of the electrode portion.

2. The circuit board according to claim 1, wherein the foot portion is reduced in thickness stepwise from the electrode portion toward the extending portion.

3. The circuit board according to claim 1, wherein the foot portion is continuously reduced in thickness from the electrode portion toward the extending portion.

4. The circuit board according to claim 1, wherein a plurality of insulating layers and a plurality of wiring patterns are alternately stacked over the resistance element.

5. The circuit board according to claim 1, wherein a tangent of an inclination of the foot portion is smaller than 1.

6. A resistance element comprising:
a resistance pattern formed on an insulating layer and including an electrode portion and an extending portion; and
an electrode formed over the electrode portion of the resistance pattern and including a foot portion reduced in thickness toward the extending portion,
wherein the electrode is formed only on an upper surface of the electrode portion.

7. The resistance element according to claim 6, wherein the electrode is made of a material having a lower sheet resistance than the resistance pattern.

8. The resistance element according to claim 6, wherein the foot portion is reduced in thickness stepwise from the electrode portion toward the extending portion.

9. The resistance element according to claim 6, wherein the foot portion is continuously reduced in thickness from the electrode portion toward the extending portion.

* * * * *